United States Patent
King

(10) Patent No.: US 11,041,898 B2
(45) Date of Patent: Jun. 22, 2021

(54) METHOD OF LOCATING A FAULT IN A POWER TRANSMISSION MEDIUM

(71) Applicant: General Electric Technology GmbH, Baden (CH)

(72) Inventor: Rosemary King, Stafford (GB)

(73) Assignee: General Electric Technology GmbH, Baden (CH)

( * ) Notice: Subject to any disclaimer, the term of this patent is extended or adjusted under 35 U.S.C. 154(b) by 209 days.

(21) Appl. No.: 16/062,874

(22) PCT Filed: Dec. 7, 2016

(86) PCT No.: PCT/EP2016/080030
§ 371 (c)(1),
(2) Date: Jun. 15, 2018

(87) PCT Pub. No.: WO2017/102488
PCT Pub. Date: Jun. 22, 2017

(65) Prior Publication Data
US 2018/0372789 A1    Dec. 27, 2018

(30) Foreign Application Priority Data
Dec. 17, 2015    (GB) .................................. 1522251

(51) Int. Cl.
*G01R 31/08* (2020.01)
(52) U.S. Cl.
CPC ......... *G01R 31/085* (2013.01); *G01R 31/086* (2013.01); *G01R 31/088* (2013.01)
(58) Field of Classification Search
CPC .. G01R 31/085; G01R 31/088; G01R 31/086; G01R 31/3275; G01R 15/18; G01R 15/207; G01R 31/08
(Continued)

(56) References Cited

U.S. PATENT DOCUMENTS

| 4,500,834 A | * | 2/1985 | Ko | ................. | H02H 7/265 |
| | | | | | 324/534 |
| 2014/0015539 A1 | * | 1/2014 | Jung | ................. | G01R 31/085 |
| | | | | | 324/512 |
| 2014/0336959 A1 | * | 11/2014 | Thomas | ............. | G01R 31/08 |
| | | | | | 702/59 |

FOREIGN PATENT DOCUMENTS

DE    3812432 A1    10/1989
EP    2 411 823 A1    2/2012

OTHER PUBLICATIONS

Xie, F, et al., "Single-ended fault location method based on wavelet theory: Application to a double-circuit transmission line," 48th International Universities Power Engineering Conference (UPE), pp. 1-6 (Sep. 2, 2013).

(Continued)

*Primary Examiner* — Melissa J Koval
*Assistant Examiner* — Trung Q Nguyen
(74) *Attorney, Agent, or Firm* — Eversheds Sutherland (US) LLP

(57) ABSTRACT

There is provided a method of locating a fault in a power transmission medium, including: monitoring, at a first monitoring location, an electrical characteristic of a power transmission medium at a plurality of frequencies; detecting, at the first monitoring location, a set of propagating fault signals including: a first propagating fault signal of the electrical characteristic at a first frequency of the plurality of frequencies, and a second propagating fault signal of the electrical characteristic at a second frequency of the plurality of frequencies, wherein each propagating fault signal is caused by the fault in the power transmission medium; comparing the first and second propagating fault signals with one another to obtain a set comparison value; and determining a location of the fault in the power transmission (Continued)

medium by deriving, from the set comparison value, a fault distance from the first monitoring location.

16 Claims, 5 Drawing Sheets

(58) Field of Classification Search
USPC ........ 324/702–713, 600, 546, 505–512, 547, 324/726, 127, 500
See application file for complete search history.

(56) References Cited

OTHER PUBLICATIONS

Combined Search and Examination Report issued in connection with corresponding GB Application No. 1522251.6 dated Jun. 10, 2016.
International Search Report and Written Opinion issued in connection with corresponding PCT Application No. PCT/EP2016/080030 dated Mar. 8, 2017.
International Preliminary Report on Patentability issued in connection with corresponding PCT Application No. PCT/EP2016/080030 dated Jun. 19, 2018.

\* cited by examiner

METHOD OF LOCATING A FAULT IN A POWER TRANSMISSION MEDIUM

FIELD OF TECHNOLOGY

This disclosure relates to a method of locating a fault in a power transmission medium and a fault locator apparatus.

BACKGROUND

Accurate fault location is important in electrical power networks because it can help reduce operating costs by avoiding the need for expensive visual inspections of a power transmission medium, as well as reduce the revenue loss caused by an extended network outage.

It will be understood that a power transmission medium may be any medium that is capable of transmitting electrical power between two or more electrical terminals. Such a medium may be, but is not limited to, a power transmission cable of a HVDC network or grid, or an overhead power transmission line.

SUMMARY

According to a first aspect there is provided a method of locating a fault in a power transmission medium, the method including:
  monitoring, at a first monitoring location, an electrical characteristic of a power transmission medium at a plurality of frequencies;
  detecting, at the first monitoring location, a first set of propagating fault signals, the first set of propagating fault signals including: a first propagating fault signal of the electrical characteristic at a first frequency of the plurality of frequencies, and a second propagating fault signal of the electrical characteristic at a second frequency of the plurality of frequencies, wherein each propagating fault signal is caused by the fault in the power transmission medium;
  comparing the first and second propagating fault signals of the first set of propagating fault signals with one another to obtain a first set comparison value; and
  determining a location of the fault in the power transmission medium by deriving, from the first set comparison value, a fault distance from the first monitoring location.

It will be appreciated that the use of the terms "first" and "second" in the patent specification is merely intended to help distinguish between similar features (e.g. the first and second propagating fault signals), and is not intended to indicate the relative importance of one feature over another feature.

The step of detecting, at the first monitoring location, a first set of propagating fault signals including the first and second propagating fault signals as outlined above makes use of an inherent difference in the propagating fault signals that occurs at different frequencies. As such, a comparison between each propagating fault signal can be made and thereafter used to determine a location of the fault in the power transmission medium.

Such a step also means that the location of the fault in the power transmission medium can be determined without having to rely on a reflected pulse signal through the power transmission medium, e.g. like that used in a travelling wave based technique. Relying on measuring a reflected pulse signal can be unreliable, especially in the case of long (e.g. over 100 km) power transmission mediums, because the reflected pulse signal begins to attenuate as it travels through the power transmission medium. As a result, the reflected pulse signal can be difficult to measure accurately and, in some case, cannot be measured at all (i.e. due to the length of the power transmission medium).

Moreover, relying on measuring a reflected pulse signal can be time consuming since the pulse signal must reflect and travel along the power transmission medium before it is measured, thus increasing the time it takes to measure the reflected pulse signal.

In addition to the foregoing, the fault location can be determined by monitoring a single electrical characteristic at a single monitoring location. As a result, the complexity of the method and the number of components needed to carry out the method can be reduced.

In one embodiment, the step of comparing the first and second propagating fault signals of the first set of propagating fault signals with one another includes comparing a detection time of the first propagating fault signal with a detection time of the second propagating fault signal to obtain a time interval between detecting the first propagating fault signal and the second propagating fault signal;
  wherein the step of determining a location of the fault in the power transmission medium includes deriving, from the time interval, a fault distance from the first monitoring location.

Obtaining a time interval between detecting the first propagating fault signal and the second propagating fault signal in the manner set out above makes use of the fact that the propagation velocity of a power transmission medium varies with frequency. As such, an inherent difference in the propagating fault signals, i.e. the velocity of the propagating fault signals through the power transmission medium, occurs at the first and second frequencies, thus the propagating fault signals will be detected at different times.

In another embodiment, the step of comparing the first and second propagating fault signals of the first set of propagating fault signals with one another includes comparing an amplitude of the first propagating fault signal with an amplitude of the second propagating fault signal to obtain an amplitude ratio; and includes:
  wherein the step of determining a location of the fault in the power transmission medium includes deriving, from the amplitude ratio, a fault distance from the first monitoring location.
  Obtaining an amplitude ratio in the manner set out above makes use of the fact that the attenuation of a propagating fault signal varies with frequency. As such, an inherent difference in the propagating fault signals, i.e. the amplitude of the propagating fault signals, occurs at the first and second frequencies.

It will be understood that the method may include the step of obtaining both a time interval and an amplitude ratio which are each used to derive respective fault distances from the first monitoring location. Such a step increases the number of fault distances being derived and thus increases the reliability and accuracy of the method.

Optionally the step of monitoring, at a first monitoring location, includes monitoring a plurality of electrical characteristics of the power transmission medium at a plurality of frequencies, and the step of detecting, at the first monitoring location, a first set of propagating fault signals, the first set of propagating fault signals includes: a first propagating fault signal of each electrical characteristic at the first frequency of the plurality of frequencies, and a second propagating fault signal of each electrical characteristic at the second frequency of the plurality of frequencies, wherein each propagating signal is caused by the fault in the power transmission medium.

Monitoring a plurality of electrical characteristics of the power transmission medium and detecting a first set of propagating fault signals that includes a first propagating fault signal of each electrical characteristic at the first frequency of the plurality of frequencies, and a second propagating fault signal of each electrical characteristic at the second frequency of the plurality of frequencies, increases the number of first and second propagating fault signals being detected. Such an increase of the number of first and second propagating fault signals provides a higher degree of flexibility in the subsequent steps of the method.

The method includes the step of: comparing the first and second propagating fault signals of each of the electrical characteristics with one another to obtain respective first set comparison values; wherein the step of determining a location of the fault in the power transmission medium includes deriving, from each of the respective first set comparison values, respective fault distances from the first monitoring location.

Obtaining respective first set comparison values and deriving, from each of the respective first set comparison values, respective fault distances from the first monitoring location improves the accuracy of the method of locating a fault since there is a plurality of respective fault distances which could all be investigated to locate the position of the fault in the power transmission medium, for example.

The step of determining a location of the fault in the power transmission medium may further include calculating an average of each of the respective fault distances to obtain an average fault distance from the first monitoring location.

Calculating an average of each of the respective fault distances to obtain an average fault distance from the first monitoring location improves the accuracy of locating the fault since the single fault distance has been calculated from a plurality of fault distances. Calculating the average also permits a tolerance band, i.e. consisting of the lowest and highest values of the respective fault distances, to be applied to the average fault distance. Such a tolerance band helps a maintenance operative when investigating the fault.

In some embodiments the method includes the step of: comparing the first and second propagating fault signals of each of the electrical characteristics with one another to obtain respective first set comparison values, and calculating an average of each of the respective first set comparison values to obtain an average first set comparison value. The step of determining a location of the fault in the power transmission medium includes deriving, from the average first set comparison value, a fault distance from the first monitoring location.

Adopting such steps reduces the computation time since a single average first set comparison value is used to calculate a single fault distance.

In some embodiments, only an average first set comparison value is determined such that a single fault distance is derived. In other embodiments, both respective fault distances from the first monitoring location (as derived from each of the respective first set comparison values) and a single fault distance derived from the average first set comparison value are obtained. In this way, a tolerance band from the respective fault distances can be applied to the single fault distance derived from the average first set comparison value.

Optionally the step of detecting, at the first monitoring location, a first set of propagating fault signals, the first set of propagating fault signals additionally includes: one or more further propagating fault signal of the electrical characteristic at a respective other frequency of the plurality of frequencies, wherein the or each further propagating fault signal is caused by the fault in the power transmission medium;

wherein the method includes the step of: comparing the first, second, and the or each further propagating fault signals with one another to obtain more than one first set comparison value.

The first set of propagating fault signals additionally including one or more further propagating fault signal of the electrical characteristic at a respective other frequency of the plurality of frequencies increases the number of propagating fault signals that can then be compared with one another. In turn, the number of first set comparison values is increased which provides a higher degree of flexibility in the subsequent steps of the method.

The step of comparing the first, second and the or each further propagation fault signals with one another includes comparing each of the first, second and the or each further propagation fault signal with each of the other first, second and the or each further propagation fault signal.

Such a step means that each of the propagation fault signals is compared with each of the other propagation fault signals which provides a maximum number of first set comparison values.

The step of determining a location of the fault in the power transmission medium includes deriving, from each of the first set comparison values, respective fault distances from the first monitoring location.

Deriving, from each of the first set comparison values, respective fault distances from the first monitoring location improves the accuracy of the method of locating a fault since there is a plurality of respective fault distances. For example, all of the fault distances could be investigated to locate the position of the fault in the power transmission medium.

The step of determining a location of the fault in the power transmission medium may further include calculating an average of each of the respective fault distances to obtain an average fault distance from the first monitoring location.

Calculating an average of each of the respective fault distances to obtain an average fault distance from the first monitoring location simplifies the locating of the fault while at the same time improving the accuracy of the method of locating a fault.

In embodiments, the step of detecting, at the first monitoring location, a first set of propagating fault signals, the first set of propagating fault signals additionally includes: one or more further propagating fault signal of each electrical characteristic at a respective other frequency of the plurality of frequencies, wherein each further propagating fault signal is caused by the fault in the power transmission medium.

The method may include the step of: comparing the first, second and the or each further propagating fault signals of each electrical characteristic with one another to obtain more than one first set comparison value.

The first set of propagating fault signals additionally including one or more further propagating fault signal of each electrical characteristic at a respective other frequency of the plurality of frequencies permits the method to include a combination of monitoring a plurality of electrical characteristics of the power transmission medium and one or more further propagating fault signals at a respective other frequency. Accordingly, the accuracy of the fault locating method is improved.

It will be understood that any of the steps can be applied to the first set of propagating fault signals which additionally include: one or more further propagating fault signal of each electrical characteristic at a respective other frequency of the plurality of frequencies, wherein the or each further propagating fault signal is caused by the fault in the power transmission medium.

Optionally the method further includes the steps of:
monitoring, at a second monitoring location, an electrical characteristic of the power transmission medium at a plurality of frequencies;
detecting, at the second monitoring location, a second set of propagation fault signals, the second set of propagation fault signals including: a first propagating fault signal of the electrical characteristic at the first frequency, and a second propagating fault signal of the electrical characteristic at the second frequency, wherein each propagating fault signal is caused by the fault in the power transmission medium;
comparing the first and second propagating fault signals of the second set of propagating fault signals with one another to obtain a second set comparison value; and
determining a location of the fault in the power transmission medium by deriving, from the second set comparison value, a fault distance from the second monitoring location.

Such additional steps improve the accuracy of the method of locating a fault since a fault distance from the first monitoring location is derived and a fault distance from the second monitoring location is also derived, and these can be compared before further action is taken. This can be particularly advantageous when the method is applied to locating a fault on a protected power transmission medium wherein the time taken to locate the fault is not as critical as that of an unprotected power transmission medium.

It will be understood that any of the steps in relation to the first set of propagation fault signals can be applied in the same manner to the second set of propagation fault signals. The application therefore covers the wording where the phrase: "the first set of propagation fault signals" is replaced with "the second set of propagation fault signals", and where the phrase "first set comparison value" is replaced with the phrase "second set comparison value", and where the phrase "the first monitoring location" is replaced with the phrase "the second monitoring location".

The step of comparing the first and second propagating fault signals of the second set of propagating fault signals with one another may include comparing the first propagating fault signal of the first set of propagating fault signals with the first propagating fault signal of the second set of propagating fault signals to obtain a first combined set comparison value, and comparing the second propagating fault signal of the first set of propagating fault signals with the second propagating fault signal of the second set of propagating fault signals to obtain a second combined set comparison value.

Comparing the first and second propagating fault signals of the first set of propagating fault signals with the first and second propagating fault signals of the second set of propagating fault signals in the manner set out above increases the flexibility of the subsequent steps that can be taken in the method because more than one comparison value is obtained. At the same time, the accuracy of the or each fault distance that can be derived from the comparison values is increased due to the comparison values being obtained from measurements at two locations on the power transmission medium.

Optionally the step of determining a location of the fault in the power transmission medium includes deriving, from each of the first and second combined set comparison values, respective fault distances from one of the first and second monitoring locations.

In this regard, from which of the first and second monitoring locations the fault distances are derived will depend on the convenience of where to locate the equipment necessary to carry out the method steps. For example, in the case of an offshore link, a monitoring location which is onshore would be advantageous because it is easier to access the equipment. In the case of a meshed network, a monitoring location at which there are the most cable connections (i.e. a node with many cable connections) would be advantageous since a single piece of equipment could be used for all of the cable connections.

The method may further include the step of: comparing the first propagating fault signal of the first set of propagating fault signals with the first propagating fault signal of the second set of propagating fault signals to obtain a first combined set comparison value, and comparing the second propagating fault signal of the first set of propagating fault signals with the second propagating fault signal of the second set of propagating fault signals to obtain a second combined set comparison value.

Including the further step of comparing the first and second propagating fault signals of the first set of propagating fault signals with the first and second propagating fault signals of the second set of propagating fault signals in the manner set out above results in an increased number of comparison values, namely a first set comparison value, a second set comparison value, a first combined set comparison value and a second combined set comparison value. As a result, the flexibility in the subsequent steps of the method to determine the location of the fault is further increased.

According to a second aspect there is provided a fault locator apparatus including: a first fault location device to monitor, at a first monitoring location, an electrical characteristic of a power transmission medium at a plurality of frequencies, the first fault location device being configured to detect, at the first monitoring location, a first set of propagation fault signals, the first set of propagation fault signals including: a first propagating fault signal of the electrical characteristic at a first frequency of the plurality of frequencies, and a second propagating fault signal of the electrical characteristic at a second frequency of the plurality of frequencies, wherein each propagating fault signal is caused by a fault in the power transmission medium, the first fault location device being further configured to compare the first and second propagating fault signals of the first set of propagating fault signals with one another to obtain a first set comparison value, the first fault location device being further still configured to determine a location of the fault in the power transmission medium by deriving, from the first set comparison value, a fault distance from the first monitoring location.

The fault locator apparatus may further include: a second fault location device to monitor, at a second monitoring location, an electrical characteristic of the power transmission medium at a plurality of frequencies, the second fault location device being configured to detect, at the second monitoring location, a second set of propagation fault signals, the second set of propagation fault signals including: a first propagating fault signal of the electrical characteristic at the first frequency, and a second propagating fault signal of the electrical characteristic at the second frequency, wherein each propagating fault signal is caused by the fault in the power transmission medium, the second fault location device being further configured to compare the first and second propagating fault signals of the second set of propagating fault signals with one another to obtain a second set comparison value, the second fault location device being further still configured to determine a location of the fault in the power transmission medium by deriving, from the second set comparison value, a fault distance from the second monitoring location.

The apparatus of the disclosure shares the advantages of the corresponding steps of the method of the disclosure.

It will be understood that the first and second fault location devices may also record the data that it monitors. Such data could be recorded over a time frame of a few seconds then re-written, unless a fault is detected in which case the data would be saved to another more permanent form so that it can be analysed at a later date. Recording the fault data in this manner also means it can be used to determine the fault location offline if needed.

BRIEF DESCRIPTION OF THE DRAWINGS

Some embodiments will now be described, by way of non-limiting examples, with reference to the accompanying drawings in which.

DETAILED DESCRIPTION

Figure 1:
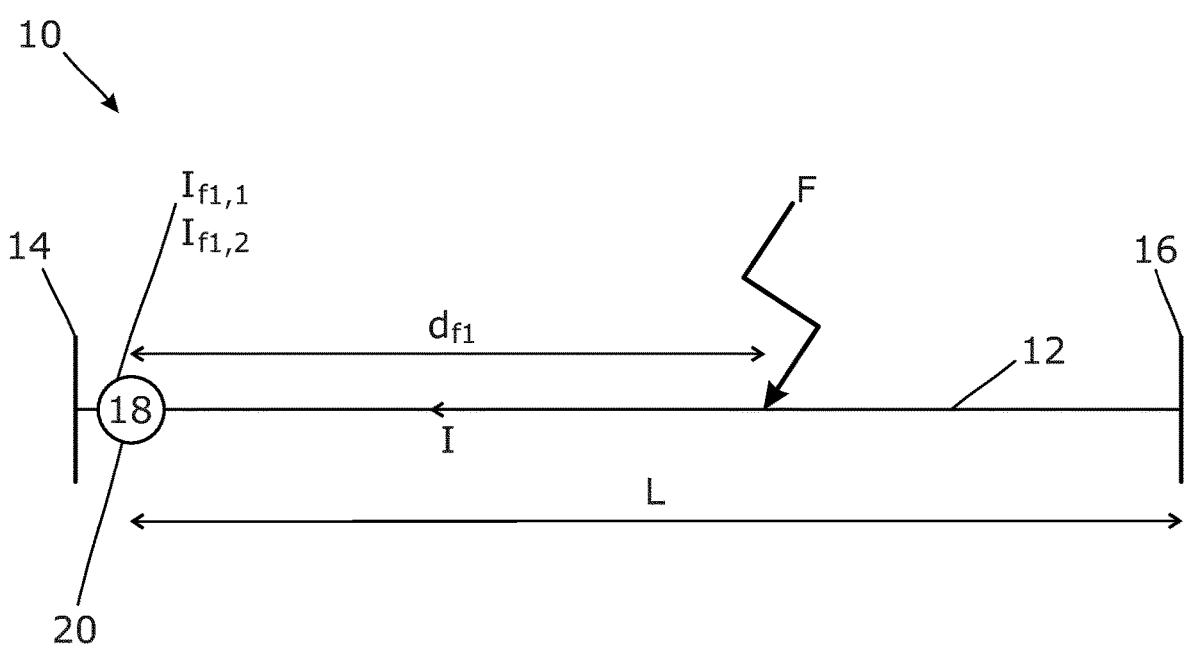
FIG. 1 shows a schematic view of a fault locator apparatus which carries out the method according to a first, second, third, fourth and fifth embodiment.

A fault locator apparatus which carries out the method according to a first embodiment is designated generally by the reference numeral 10 and is shown in FIG. 1.

The fault locator apparatus 10 is installed on a power transmission medium 12. The power transmission medium 12 extends between first and second terminals 14, 16 and in this embodiment has a length L of at least 100 km. It will be understood that the power transmission medium 12 could have a length L of less than 100 km. The power transmission medium 12 is a DC cable which forms part of a HVDC grid but could instead be part of an AC grid or it could be an overhead line.

The fault locator apparatus 10 also includes a first fault location device 18 positioned at a first monitoring location 20 on the power transmission medium 12. The first fault location device 18 is configured to carry out the method of the first to fifth embodiments, as described in more detail below.

In the embodiment shown in FIG. 1, the first monitoring location 20 is positioned towards the first terminal 14. The first monitoring location 18 may instead be positioned at the first terminal 14, or instead at or towards the second terminal 16.

The method according to the first embodiment includes:
monitoring, at the first monitoring location 20, an electrical characteristic of the power transmission medium 12 at a plurality of frequencies;
detecting, at the first monitoring location 20, a first set of propagating fault signals, the first set of propagating fault signals including: a first propagating fault signal of the electrical characteristic at a first frequency of the plurality of frequencies, and a second propagating fault signal of the electrical characteristic at a second frequency of the plurality of frequencies, wherein each propagating fault signal is caused by a fault F in the power transmission medium 12;
comparing the first and second propagating fault signals of the first set of propagating fault signals with one another to obtain a first set comparison value; and
determining a location of the fault F in the power transmission medium 12 by deriving, from the first set comparison value, a fault distance $d_{f1}$ from the first monitoring location 20.

The electrical characteristic is a current I flowing through the power transmission medium 12. The first propagating fault signal of the current I is a first fault current signal $I_{f1,1}$ which is detected at the first frequency of the plurality of frequencies, and the second propagating fault signal of the current I is a second fault current signal $I_{f1,2}$ which is detected at the second frequency of the plurality of frequencies. The electrical characteristic may instead be a voltage of the power transmission medium 12.

The first frequency is 10 kHz and the second frequency is 100 Hz. The first and second propagating fault signals are detected via a filter (not shown), such as a band-pass filter. The first and second frequencies may instead be other values.

Figure 2:
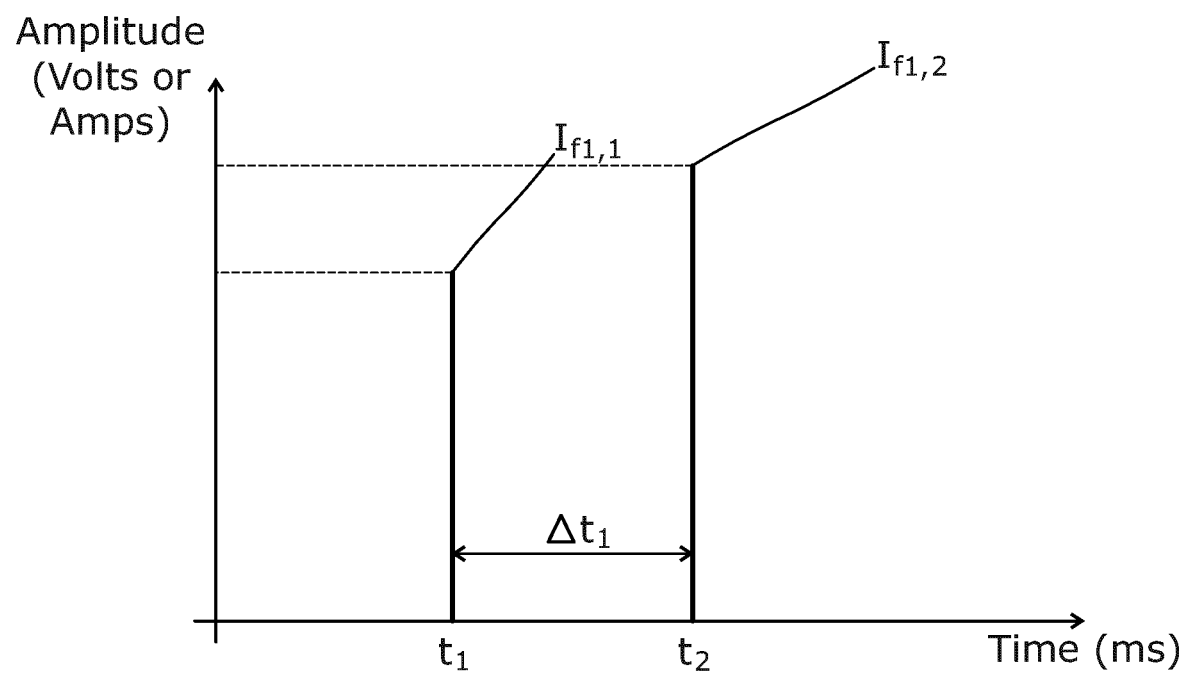
FIG. 2 illustrates, in a graphical format, the first embodiment.

As shown in FIG. 2, the step of comparing the first and second fault current signals $I_{f1,1}$, $I_{1,2}$ of the first set of propagating fault signals with one another includes detecting an arrival time $t_1$ of the first fault current signal $I_{f1,1}$ and detecting an arrival time $t_2$ of the second fault current signal $I_{f1,2}$. The arrival time has the same meaning as the detection time.

The method of the first embodiment further includes the step of taking a difference between the arrival time $t_1$ of the first fault current signal $I_{f1,1}$ and the time of arrival $t_2$ of the second fault current signal $I_{f1,2}$ to obtain a time interval $\Delta t_1$ at the first monitoring location 20 (i.e. the first set comparison value).

Moreover, the step of determining a location of the fault F in the power transmission medium 12 includes deriving, from the time interval $\Delta t_1$ at the first monitoring location 20, the fault distance $d_{f1}$ from the first monitoring location 20.

The propagation velocity of a signal through the power transmission medium 12 at 10 kHz is around $16 \times 10^7$ m/s while the propagation velocity of a signal through the power transmission medium 12 at 100 Hz is around $8 \times 10^7$ m/s. Therefore when a fault F occurs in the power transmission medium 12, the resulting fault current will be detected at the first frequency before it is detected at the second frequency. Accordingly, the first fault current signal $I_{f1,1}$ will have an arrival time $t_1$ that is smaller, i.e. quicker, than the arrival time $t_2$ of the second fault current signal $I_{f1,2}$.

For example, if the fault F occurs at a fault distance $d_{f1}$ of 100 km from the first monitoring location 20, the time of arrival $t_1$ of the first fault current signal $I_{f1,1}$ would be 0.625 ms, while the time of arrival $t_2$ of the second fault current signal $I_{f1,2}$ would be 1.25 ms. The resulting time interval $\Delta t_1$ at the first monitoring location 20 would therefore be 0.625 ms.

In another example, if the fault F occurs at a fault distance $d_{f1}$ of 200 km from the first monitoring location 20, the time of arrival $t_1$ of the first fault current signal $I_{f1,1}$ would be 1.25 ms, while the time of arrival $t_2$ of the second fault current signal $I_{f1,2}$ would be 2.5 ms. The resulting time interval $\Delta t_1$ at the first monitoring location 20 would therefore be 1.25 ms.

It can be seen from the examples given above that the time interval $\Delta t_1$ increases linearly with an increase of the fault distance $d_{f1}$. Such a relationship enables a fault distance $d_{f1}$ from the first monitoring location 20 to be derived from the time interval $\Delta t_1$.

More specifically, the step of determining a location of the fault F in the power transmission medium 12 includes comparing a predetermined set of comparison values and corresponding fault distances $d_{f1}$ with the obtained first set comparison value. In other words, a look-up table of predetermined time intervals $\Delta t_1$ and corresponding fault distances $d_{f1}$ from the first monitoring location 20 is cross-referenced with the obtained time interval $\Delta t_1$.

Once the location of the fault F has been determined, the method can trigger a protective measure to clear the fault, such as triggering DC circuit breakers at either end of the power transmission medium 12. Alternatively, or in addition, a maintenance operative can investigate the fault F and carry out any necessary repair.

A second embodiment will now be described wherein the second embodiment shares features shown in FIG. 1 and as described above in relation to the first embodiment. However, in a second embodiment, the step of comparing the first and second fault current signals $I_{f1,1}$, $I_{f1,2}$ with one another includes measuring an amplitude $A_1$ of the first fault current signal $I_{f1,1}$ and measuring an amplitude $A_2$ of the second fault current signals $I_{f1,2}$.

Moreover, the method of the second embodiment includes comparing the amplitude $A_1$ of the first fault current signal $I_{f1,1}$ with the amplitude $A_2$ of the second fault current signal $I_{f1,2}$ to obtain an amplitude ratio $$\frac{A_2}{A_1}.$$

In addition to the foregoing, the second embodiment differs from the first embodiment in that the step of determining a location of the fault F in the power transmission medium 20 includes deriving, from the amplitude ratio $$\frac{A_2}{A_1},$$

the fault distance $d_{f1}$ from the first monitoring location 20.

The step of determining a location of the fault F is based on the formula for the propagation characteristics of a power transmission medium 12, such as a cable, which is:

$$H(\omega) = e^{-(\sqrt{Y(\omega)Z(\omega)})L} \quad \text{[Equation 1]}$$

Wherein: $H(\omega)$ is the propagation function;

Y is the shunt admittance of the power transmission medium 12;

Z is the series impedance of the power transmission medium 12;

$(\sqrt{Y(\omega)Z(\omega)})$ is the angular frequency;

L is the length of the power transmission medium 12

Figure 3A:
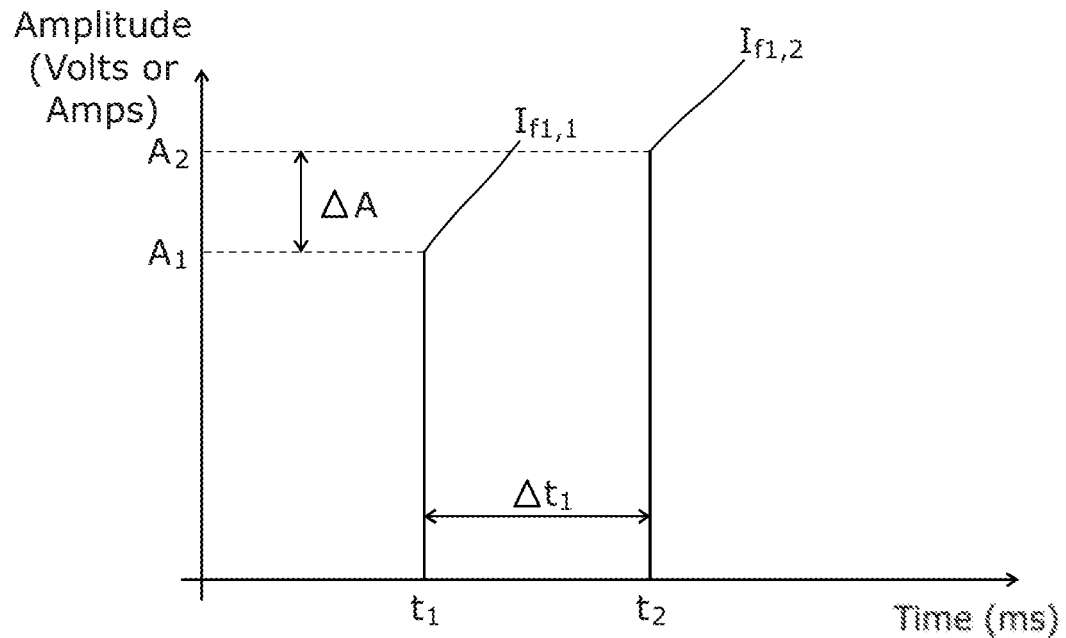
FIG. 3A illustrates, in a graphical format, the second embodiment.
Figure 3B:
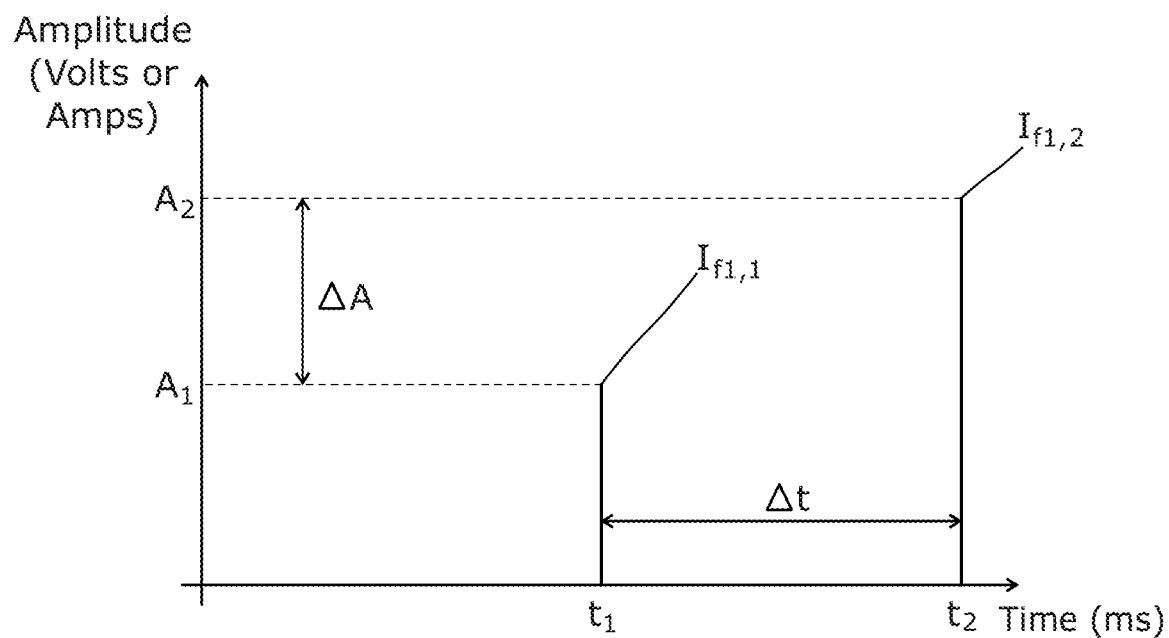
FIG. 3B illustrates, in graphical format, the second embodiment.

For a cable, this formula means that an amplitude measured at a higher frequency is more strongly attenuated than that measured at a lower frequency. FIG. 3A shows the amplitudes $A_1$, $A_2$ of the first and second fault current signals $I_{f1,1}$, $I_{f1,2}$ when the fault distance $d_{f1}$ from the first monitoring location is 100 km, while FIG. 3B shows the amplitudes $A_1$, $A_2$ of the first and second fault current signals $I_{f1,1}$, $I_{f1,2}$ when the fault distance $d_{f1}$ from the first monitoring location is 200 km. It can be seen that a difference in amplitude $\Delta A$ between the amplitudes $A_1$, $A_2$ of the first and second fault current signals $I_{f1,1}$, $I_{f1,2}$ is greater for a fault F that is located further away from the first monitoring location 20 (i.e. in FIG. 3B) than that for a fault F that is located nearer the first monitoring location 20 (i.e. in FIG. 3A).

The second embodiment further includes the step of calculating a value of $\sqrt{Y(\omega)Z(\omega)}$ at each of the first and second frequencies. The value of $\sqrt{Y(\omega)Z(\omega)}$ may instead be measured, for example during commissioning of the power transmission medium 12. The fault distance can then be derived through use of the following formula:

$$d_{f1} = \frac{\ln\left(\frac{A_2}{A_1}\right)}{(\alpha_z - \alpha_1)} \quad \text{[Equation 2]}$$

Wherein: $d_{f1}$ is the fault distance from the first monitoring location 20;

$A_1$ is the measured amplitude of the first fault current signal $I_{f1,1}$;

$A_2$ is the measured amplitude of the second fault current signal $I_{f1,2}$;

$\alpha_1$ is the real $\sqrt{Y(\omega)Z(\omega)}$ value at the first frequency;

$\alpha_2$ is the real $\sqrt{Y(\omega)Z(\omega)}$ value at the second frequency.

There is therefore a relationship between the fault distance $d_{f1}$ and the amplitude ratio $$\frac{A_2}{A_1}$$

and such a relationship is used to determine the location of the fault F in the power transmission medium 12. More specifically, as with the first embodiment, the amplitude ratio $$\frac{A_2}{A_1}$$

is compared with a predetermined set of amplitude ratios $$\frac{A_2}{A_1}$$

and corresponding fault locations $d_{fn}$. Alternatively, the fault distance $d_{fn}$ is calculated directly from equation 2 as set out above.

In other embodiments, both a time interval $\Delta t_1$ and amplitude ratio $$\frac{A_2}{A_1}$$

at the first monitoring location 20 are obtained such that respective fault distances from the first monitoring location 20 are derived. Thus, two fault distances are derived; one which is derived from the time interval $\Delta t_1$ and one which is derived from the amplitude ratio $$\frac{A_2}{A_1}.$$

Both of the fault distances, if different from one another, can be investigated by a maintenance operator to, e.g. fix the fault. Alternatively, an average of the two fault distances can be calculated.

A third embodiment will now be described wherein the third embodiment shares the features shown in FIG. 1 and as described above in relation to the first embodiment. The third embodiment differs from the first embodiment in that the step of monitoring, at the first monitoring location 20, includes monitoring a current and a voltage of the power transmission medium 12 at a plurality of frequencies, i.e. it monitors two electrical characteristics.

Moreover, in the third embodiment, the first set of propagating fault signals includes: a first propagating fault signal of each of the current and voltage at the first frequency of the plurality of frequencies, and a second propagating fault signal of each of the current I and voltage at the second frequency of the plurality of frequencies, wherein each propagating fault signal is caused by the fault F in the power transmission medium 12.

As such, the first set of propagating fault signals includes two first propagating fault signals and two second propagating fault signals. The two first propagating fault signals in this embodiment are a first fault current signal (which is detected at the first frequency) and a first fault voltage signal (which is detected at the first frequency), while the two second propagating fault signals are a second fault current signal (which is detected at the second frequency) and a second fault voltage signal (which is detected at the second frequency).

The time of arrival of each of the first and second fault current signals is measured and then compared to obtain a first time interval at the first monitoring location 20. The time of arrival of each of the first and second fault voltage signals is also measured and then compared to obtain a second time interval at the first monitoring location 20. As such, two first set comparison values are obtained.

Next, the method of the third embodiment derives, from each of the first and second time intervals at the first monitoring location 20, first and second fault distances from the first monitoring location 20.

The third embodiment further includes the step of calculating an average of the first and second fault distances to obtain an average fault distance from the first monitoring location 20. The average fault distance is then used to determine a location of the fault F in the power transmission medium 12.

Alternatively, each of the first and second fault distances from the first monitoring location 20 could be investigated by a maintenance operative. A single fault distance from the first monitoring location 20 may instead be derived by choosing one of the first and second time intervals at the first monitoring location 20 to use in the subsequent step of determining a fault location.

The comparison values in the third embodiment may instead be amplitude ratios, as described above in relation to the second embodiment. The comparison values may instead be a mixture of both a time interval and an amplitude ratio at the first monitoring location 20.

A fourth embodiment is now described which shares features of the third embodiment. The fourth embodiment differs from the third embodiment in that it includes the step of calculating an average of the first and second time intervals at the first monitoring location 20 to obtain an average time interval, i.e. an average comparison value.

The average time interval is then used in the fourth embodiment to derive a fault distance from the first monitoring location 20 so as to determine a location of the fault F in the power transmission medium 12.

Much like in the third embodiment, the comparison values in the fourth embodiment may instead be amplitude ratios such that an average amplitude ratio is calculated.

A fifth embodiment is now described which shares features of the first embodiment as described hereinabove and as shown in FIG. 1. The fifth embodiment differs from the first embodiment in that the first set of propagating fault signals additionally includes: a further propagating fault signal of the current at another frequency of the plurality of frequencies, wherein the or each further propagating fault signal is caused by the fault F in the power transmission medium 12.

More specifically, in the fifth embodiment, first, second and third fault current signals are detected at respective first, second and third frequencies.

The fifth embodiment also includes the step of comparing the first, second and third fault current signals with one another to obtain more than one first set comparison value.

In particular, an arrival time of each of the first, second and third fault current signals is measured which provides first, second and third arrival times. Then, the first and second arrival times are compared, i.e. subtracted, so as to obtain a first time interval. The second and third arrival times are compared so as to obtain a second time interval, and the first and third arrival times are compared so as to obtain a third time interval. In this way, each of the arrival times of the first, second and third fault current signals is compared with each of the other arrival times of the first, second and third fault current signals.

The aforementioned step therefore obtains three first set comparison values at the first monitoring location 20.

Only the first and second arrival times, and the second and third arrival times may instead be compared so as to obtain only first and second time intervals, i.e. two first set comparison values.

Next, each of the first, second and third time intervals is used to derive respective fault distances from the first monitoring location. In other words, a first fault distance is derived from the first time interval, a second fault distance is derived from the second time interval and a third fault distance is derived from the third time interval.

Each of the first, second and third time intervals is then used to derive a respective first, second and third fault distance from the first monitoring location 20. In this regard, a look-up table is used to compare each time interval with the values in the look-up table so as to determine respective first, second and third fault distances from the first monitoring location 20. For example, the first, second and third frequencies may be 100 Hz, 500 Hz and 10 kHz such that a first time interval is obtained between 100 and 500 Hz. A column in the look-up table will correspond to distances for time intervals obtained between 100 and 500 Hz, and so this column would be used to determine the corresponding first fault distance. Separate columns for time intervals obtained between 500 Hz and 10 kHz, as well as for time intervals obtained between 10 and 500 kHz, would also be used to determine corresponding second and third fault distances.

An average of the first, second and third fault distances is then calculated to obtain an average fault distance from the first monitoring location 20, and thus a location of the fault in the power transmission medium 12 is determined by the average fault distance.

Alternatively, one of the first, second and third time intervals could be chosen to derive a single fault distance from the first monitoring location 20.

It will be understood that the method according to the fifth embodiment could be carried out with respect of first and second electrical characteristics (i.e. as described in relation to the third embodiment).

It will also be understood that the first set comparison values in the method according to the fifth embodiment could instead be amplitude ratios (i.e. as described in relation to the second embodiment).

Figure 4:
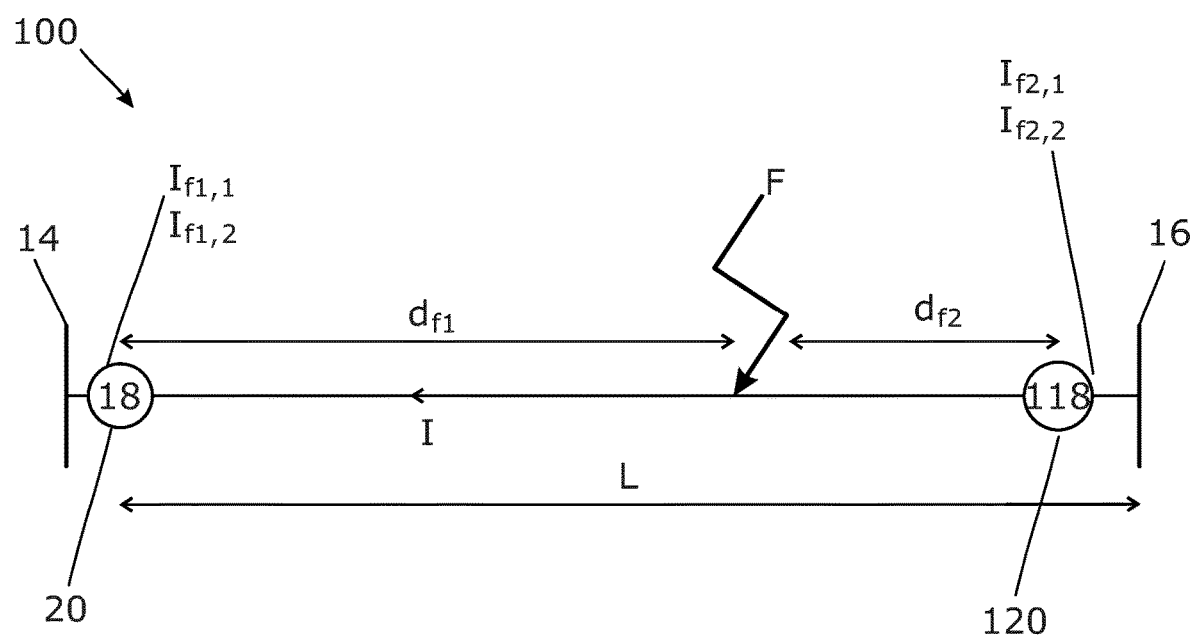
FIG. 4 shows a schematic view of a fault locator apparatus which carries out the method according to a sixth and seventh embodiment.

A fault locator apparatus which carries out the method according to a sixth embodiment is designated generally by the reference numeral 100 and is shown in FIG. 4.

The fault locator apparatus 100 includes identical features of the fault locator apparatus 10 shown in FIG. 1 and like features share the same reference numerals.

The fault locator apparatus 100 of FIG. 4 differs from the fault locator apparatus 10 of FIG. 1 in that it additionally includes a second fault location device 118 at a second monitoring location 120.

The second monitoring location 120 is positioned towards the second terminal 16 opposite the first terminal 14. The second monitoring location 120 may instead be positioned anywhere along the power transmission medium 12.

The method according to the sixth embodiment includes all the steps according to the first embodiment. The method of the sixth embodiment additionally includes the steps of:
monitoring, at the second monitoring location 120, an electrical characteristic of the power transmission medium 12 at a plurality of frequencies;
detecting, at the second monitoring location 120, a second set of propagation fault signals, the second set of propagation fault signals including: a first propagating fault signal of the electrical characteristic at the first frequency, and a second propagating fault signal of the electrical characteristic at the second frequency, wherein each propagating fault signal is caused by the fault F in the power transmission medium 12;
comparing the first and second propagating fault signals of the second set of propagating fault signals with one another to obtain a second set comparison value; and
determining a location of the fault F in the power transmission medium 12 by deriving, from the second set comparison value, a fault distance from the second monitoring location 120.

In this embodiment, the electrical characteristic being monitored at the second monitoring location is also the current I, such that the second set of propagating fault signals includes a first fault current signal $I_{f2,1}$ at the first frequency and a second fault current signal $I_{f2,2}$ at the second frequency.

In other embodiments, the electrical characteristic being monitored at the second monitoring location 120 may instead be a voltage.

Figure 5:
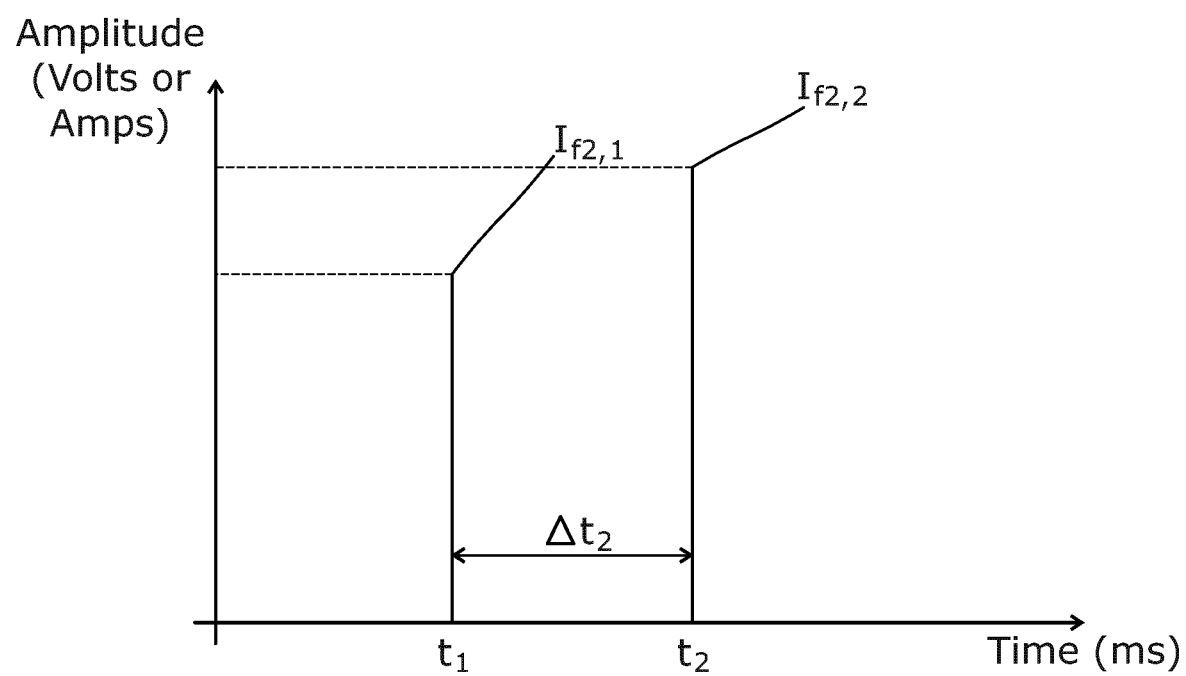
FIG. 5 illustrates, in a graphical format, the sixth embodiment.

As shown in FIG. 5, the arrival time $t_1$, $t_2$ of each of the first and second fault current signals $I_{f2,1}$, $I_{f2,2}$ is detected at the second monitoring location 120.

The first and second arrival times at the second monitoring location 120 are then compared, i.e. subtracted, to obtain a second set comparison value in the form of a time interval $\Delta t_2$ at the second monitoring location 120.

The time interval $\Delta t_2$ at the second monitoring location 120 is then used to derive a fault distance $d_{f2}$ from the second monitoring location 120. As such, two fault distances are derived: a fault distance $d_{f1}$ from the first monitoring location 20 and a fault distance $d_{f2}$ from the second monitoring location 120.

Each of the aforementioned fault distances $d_{f1}$, $d_{f2}$ can be investigated by a maintenance operative.

It will be understood that the method according to the sixth embodiment could include the step of monitoring first and second electrical characteristics at the second monitoring location 120 (i.e. as described in the third embodiment in relation to the first monitoring location).

It will also be understood that the second set comparison values in the method according to the sixth embodiment could instead be amplitude ratios at the second monitoring location 120 (i.e. as described in the second embodiment in relation to the first monitoring location).

A method according to a seventh embodiment will now be described which shares features of the sixth embodiment as described hereinabove and as shown in FIG. 4. The seventh embodiment differs from the sixth embodiment in that it includes the step of comparing, i.e. subtracting, the first arrival time at the first monitoring location 20 with the first arrival time at the second monitoring location 120 to obtain a first combined time interval, i.e. a first combined set comparison value. In a similar manner, the second arrival time at the first monitoring location 20 is compared with the second arrival time at the second monitoring location 120 to obtain a second combined time interval, i.e. a second combined set comparison value.

In this embodiment, the first and second combined time intervals are obtained in replacement of the first and second time intervals at the first and second monitoring locations 20, 120, i.e. so that the method includes obtaining first and second combined time intervals only. Alternatively, the first and second combined time intervals may be obtained in addition to the first and second time intervals at the first monitoring 20 location but in replacement of obtaining first and second time intervals at the second monitoring location 120, i.e. so that the method includes obtaining first and second time intervals at the first monitoring location 20 and first and second combined time intervals. The first and second combined time intervals may instead be obtained in addition to obtaining the first and second time intervals at both of the first and second monitoring locations 20, 120, i.e. so that the method includes obtaining first and second time intervals at the first monitoring location 20, first and second time intervals at the second monitoring location 120, and first and second combined time intervals.

The method according to the seventh embodiment also includes the step of deriving, from each of the first and second combined time intervals, respective fault distances. This is carried out through use of a look-up table which includes separate columns relating to the different frequencies at which the measurements are being taken. For example, the arrival time ti at the first monitoring location 20 of the first fault current signal $I_{f1}$ is subtracted from the arrival time at the second monitoring location 120 of the first fault current signal $I_{f1,1}$. Such subtraction creates a fault distance which is related to the centre of the cable since the subtraction would equal zero if the fault occurs in the centre of the power transmission medium 12. This value can then be related to a distance on the look-up table relative to one of the first and second monitoring locations 20, 120.

In the seventh embodiment, both of the first and second monitoring locations 20, 120 are time synchronised using, e.g. GPS.

It will be understood that the method according to the seventh embodiment could include the step of monitoring first and second electrical characteristics at the second monitoring location 120 (i.e. as described in the third embodiment in relation to the first monitoring location).

It will also be understood that the second set comparison values in the method according to the seventh embodiment could instead be amplitude ratios at the second monitoring location 120 (i.e. as described in the second embodiment in relation to the first monitoring location).

The invention claimed is:

1. A method of locating a fault in a power transmission medium, the method comprising:
   a) monitoring, at a first monitoring location, an electrical characteristic of a power transmission medium at a plurality of frequencies;
   b) detecting, at the first monitoring location, a first set of propagating fault signals, the first set of propagating fault signals including: a first propagating fault signal of the electrical characteristic at a first frequency of the plurality of frequencies, and a second propagating fault signal of the electrical characteristic at a second frequency of the plurality of frequencies, wherein each propagating fault signal is caused by the fault in the power transmission medium;
   c) comparing the first and second propagating fault signals of the first set of propagating fault signals with one another to obtain a first set comparison value;
   d) determining a location of the fault in the power transmission medium by deriving, from the first set comparison value, a fault distance from the first monitoring location, wherein comparing the first and second propagating fault signals of the first set of propagating fault signals with one another includes comparing a detection time of the first propagating fault signal with a detection time of the second propagating fault signal to obtain a time interval between detecting the fir propagating fault signal and the second propagating fault signal, and wherein determining a location of the fault in the power transmission medium includes deriving, from the time interval, a fault distance from the first monitoring location; and
   (e) triggering a protective measure to clear the fault.

2. The method according to claim 1, wherein monitoring, at a first monitoring location, includes monitoring a plurality of electrical characteristics of the power transmission medium at a plurality of frequencies; and
   wherein detecting, at the first monitoring location, a first set of propagating fault signals, the first set of propagating fault signals includes: a first propagating fault signal of each electrical characteristic at the first frequency of the plurality of frequencies, and a second propagating fault signal of each electrical characteristic at the second frequency of the plurality of frequencies, wherein each propagating signal is caused by the fault in the power transmission medium.

3. The method according to claim 2, including:
   c) comparing the first and second propagating fault signals of each of the electrical characteristics with one another to obtain respective first set comparison values, wherein determining a location of the fault in the power transmission medium includes deriving, from each of the respective first set comparison values, respective fault distances from the first monitoring location.

4. The method according to claim 3, wherein determining a location of the fault in the power transmission medium further includes calculating an average of each of the respective fault distances to obtain an average fault distance from the first monitoring location.

5. The method according to claim 2, including:
   c) comparing the first and second propagating fault signals of each of the electrical characteristics with one another to obtain respective first set comparison values, and calculating an average of each of the respective first set comparison values to obtain an average first set comparison value,
   wherein determining a location of the fault in the power transmission medium includes deriving, from the average first set comparison value, a fault distance from the first monitoring location.

6. The method according to claim 1, wherein detecting, at the first monitoring location, a first set of propagating fault signals, the first set of propagating fault signals additionally includes: one or more further propagating fault signal of the electrical characteristic at a respective other frequency of the plurality of frequencies, wherein the further propagating fault signal is caused by the fault in the power transmission medium,
   wherein the method includes:
   c) comparing the first, second and the one or more further propagating fault signals with one another to obtain more than one first set comparison value.

7. The method according to claim 6, wherein comparing the first, second and the one or more further propagation fault signals with one another includes comparing each of the first, second and the one or more further propagation fault signal with each of the other first, second and the or each further propagation fault signal.

8. The method according to claim 6, wherein determining a location of the fault in the power transmission medium includes deriving, from each of the first set comparison values, respective fault distances from the first monitoring location.

9. The method according to claim 8, wherein determining a location of the fault in the power transmission medium further includes calculating an average of each of the respective fault distances to obtain an average fault distance from the first monitoring location.

10. The method according to claim 2, wherein detecting, at the first monitoring location, a first set of propagating fault signals, the first set of propagating fault signals additionally includes: one or more further propagating fault signal of each electrical characteristic at a respective other frequency of the plurality of frequencies, wherein each further propagating fault signal is caused by the fault in the power transmission medium, wherein the method includes:
c) comparing the first, second and the one or more further propagating fault signals of each electrical characteristic with one another to obtain more than one first set comparison value.

11. The method according to claim 1, further including:
e) monitoring, at a second monitoring location, an electrical characteristic of the power transmission medium at a plurality of frequencies;
f) detecting, at the second monitoring location, a second set of propagation fault signals, the second set of propagation fault signals including: a first propagating fault signal of the electrical characteristic at the first frequency, and a second propagating fault signal of the electrical characteristic at the second frequency, wherein each propagating fault signal is caused by the fault in the power transmission medium;
g) comparing the first and second propagating fault signals of the second set of propagation fault signals with one another to obtain a second set comparison value; and
h) determining a location of the fault in the power transmission medium by deriving, from the second set comparison value, a fault distance from the second monitoring location (120).

12. The method according to claim 11, wherein comparing the first and second propagating fault signals of the second set of propagation fault signals with one another includes comparing the first propagating fault signal of the first set of propagating fault signals with the first propagating fault signal of the second set of propagating fault signals to obtain a first combined set comparison value, and comparing the second propagating fault signal of the first set of propagating fault signals with the second propagating fault signal of the second set of propagating fault signals to obtain a second combined set comparison value.

13. The method according to claim 11, wherein determining a location of the fault in the power transmission medium includes deriving, from each of the first and second combined set comparison values, respective fault distances from one of the first and second monitoring locations.

14. The method according to claim 11, further including:
i) comparing the first propagating fault signal of the first set of propagating fault signals with the first propagating fault signal of the second set of propagating fault signals to obtain a first combined set comparison value, and comparing the second propagating fault signal of the first set of propagating fault signals with the second propagating fault signal of the second set of propagating fault signals to obtain a second combined set comparison value.

15. A fault locator apparatus comprising:
a first fault location device to monitor, at a first monitoring location, an electrical characteristic of a power transmission medium at a plurality of frequencies, the first fault location device being configured to detect, at the first monitoring location, a first set of propagation fault signals, the first set of propagation fault signals including: a first propagating fault signal of the electrical characteristic at a first frequency of the plurality of frequencies, and a second propagating fault signal of the electrical characteristic at a second frequency of the plurality of frequencies, wherein each propagating fault signal is caused by a fault in the power transmission medium, the first fault location device being further configured to compare the first and second propagating fault signals of the first set of propagating fault signals with one another to obtain a first set comparison value, the first fault location device being further still configured to determine a location of the fault in the power transmission medium by deriving, from the first set comparison value, a fault distance from the first monitoring location, and trigger a protective measure to clear the fault, wherein comparing the first and second propagating fault signals of the first set of propagating fault signals with one another includes comparing an amplitude of the first propagating fault signal with an amplitude of the second propagating fault signal to obtain an amplitude ratio; and wherein determining a location of the fault in the power transmission medium includes deriving, from the amplitude ratio, a fault distance from the first monitoring location.

16. The fault locator apparatus according to claim 15, further comprising:
a second fault location device to monitor, at a second monitoring location, an electrical characteristic of the power transmission medium at a plurality of frequencies, the second fault location device being configured to detect, at the second monitoring location, a second set of propagation fault signals, the second set of propagation fault signals including: a first propagating fault signal of the electrical characteristic at the first frequency, and a second propagating fault signal of the electrical characteristic at the second frequency, wherein each propagating fault signal is caused by the fault in the power transmission medium, the second fault location device being further configured to compare the first and second propagating fault signals of the second set of propagating fault signals with one another to obtain a second set comparison value, the second fault location device being further still configured to determine a location of the fault in the power transmission medium by deriving, from the second set comparison value, a fault distance from the second monitoring location.

* * * * *